United States Patent [19]

Verhoeven et al.

[11] Patent Number: 4,532,703

[45] Date of Patent: Aug. 6, 1985

[54] METHOD OF PREPARING COMPOSITE SUPERCONDUCTING WIRE

[75] Inventors: John D. Verhoeven; Edwin D. Gibson; Douglas K. Finnemore; Jerome E. Ostenson; Frederick A. Schmidt; Charles V. Owen, all of Ames, Iowa

[73] Assignee: The United States of America as represented by the United States Department of Energy, Washington, D.C.

[21] Appl. No.: 257,013

[22] Filed: Apr. 24, 1981

Related U.S. Application Data

[63] Continuation-in-part of Ser. No. 85,653, Oct. 17, 1979, abandoned.

[51] Int. Cl.$^3$ .............................................. H01L 39/24
[52] U.S. Cl. .................................... 29/599; 148/133; 148/2; 148/127; 148/11.5 Q; 75/10 C; 219/69 E; 174/126 S; 174/126 CP; 420/495
[58] Field of Search ................ 148/2, 11.5 R, 11.5 F, 148/11.5 P, 11.5 Q, 127, 133; 75/10 RC, 134 C, 174, 153; 29/599; 164/52; 219/69 E; 174/126 S, 126 CP

[56] References Cited

U.S. PATENT DOCUMENTS

| | | | |
|---|---|---|---|
| 2,595,292 | 5/1952 | Reece | 75/122 |
| 3,817,746 | 6/1974 | Tsuei | 75/174 |
| 3,905,839 | 9/1975 | Hashimoto | 29/599 |
| 4,002,504 | 1/1977 | Howe | 148/11.5 R |

OTHER PUBLICATIONS

Tsuei et al., "Superconductivity of Copper Containing Small Amounts of Niobium" *Journal of Material Sciences*, 1973, pp. 1307–1314.

Tsuei, "Ductile Superconducting Copper-Rich Alloys Containing A-15 Filaments", IEEE Transactions on Magnetics, vol. MAG-111, No. 2, Mar. 1975, pp. 272–275.

Verhoeven et al., "Superconducting Properties on In-Situ Prepared Nb-Cu-Sn Alloys", *Appl. Phys. Letters*, 33, 101, 1978.

"Vast Savings Promised in Producing Magnets for Fusion Research", Mar. 1980, *Industrial Research and Development*, pp. 100–101.

*Primary Examiner*—Howard N. Goldberg
*Assistant Examiner*—Vernon K. Rising
*Attorney, Agent, or Firm*—James W. Weinberger; Walter L. Rees; Judson R. Hightower

[57] ABSTRACT

An improved method of preparing composite multifilament superconducting wire of Nb$_3$Sn in a copper matrix which eliminates the necessity of coating the drawn wire with tin. A generalized cylindrical billet of an alloy of copper containing at least 15 weight percent niobium, present in the copper as discrete, randomly distributed and oriented dendritic-shaped particles, is provided with at least one longitudinal opening which is filled with tin to form a composite drawing rod. The drawing rod is then drawn to form a ductile composite multifilament wire containing a filament of tin. The ductile wire containing the tin can then be wound into magnet coils or other devices before heating to diffuse the tin through the wire to react with the niobium forming Nb$_3$Sn. Also described is an improved method for making large billets of the copper-niobium alloy by consumable-arc casting.

29 Claims, 4 Drawing Figures

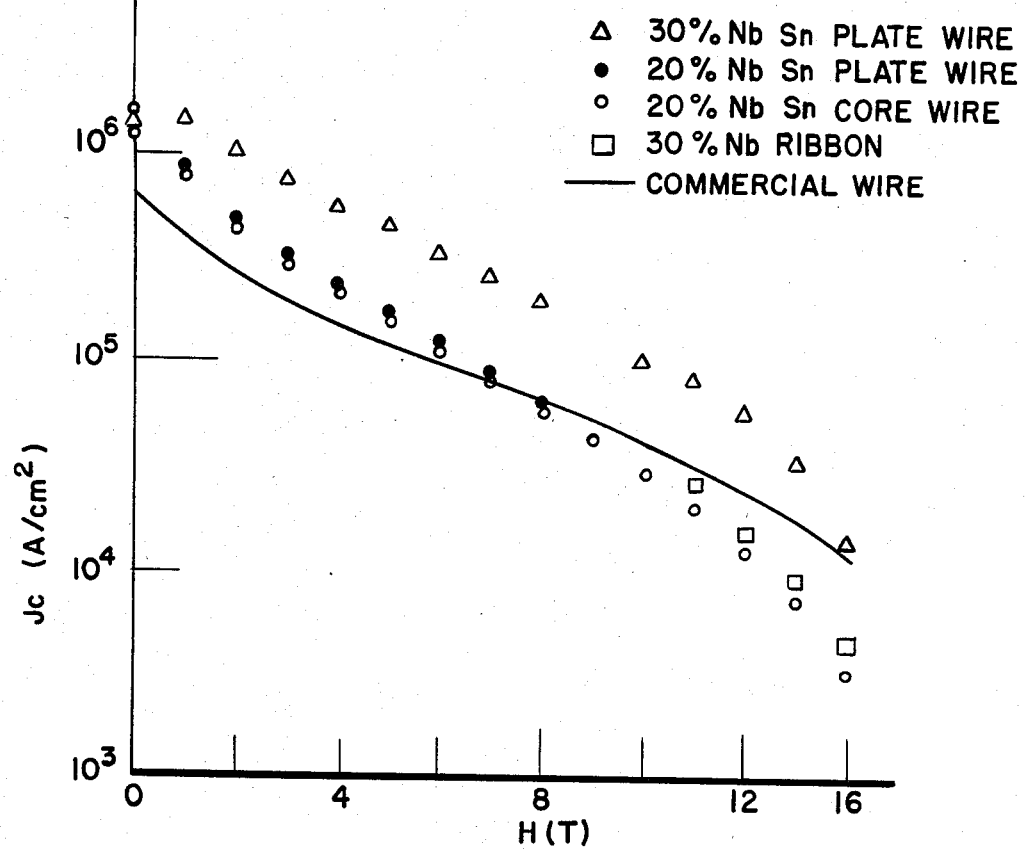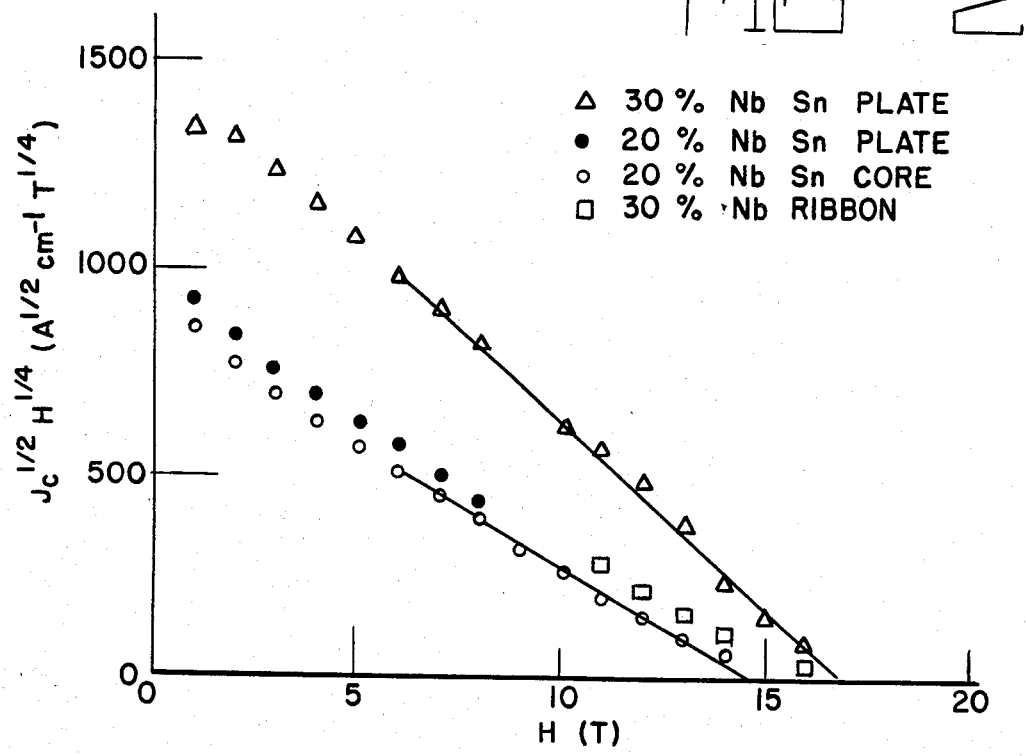

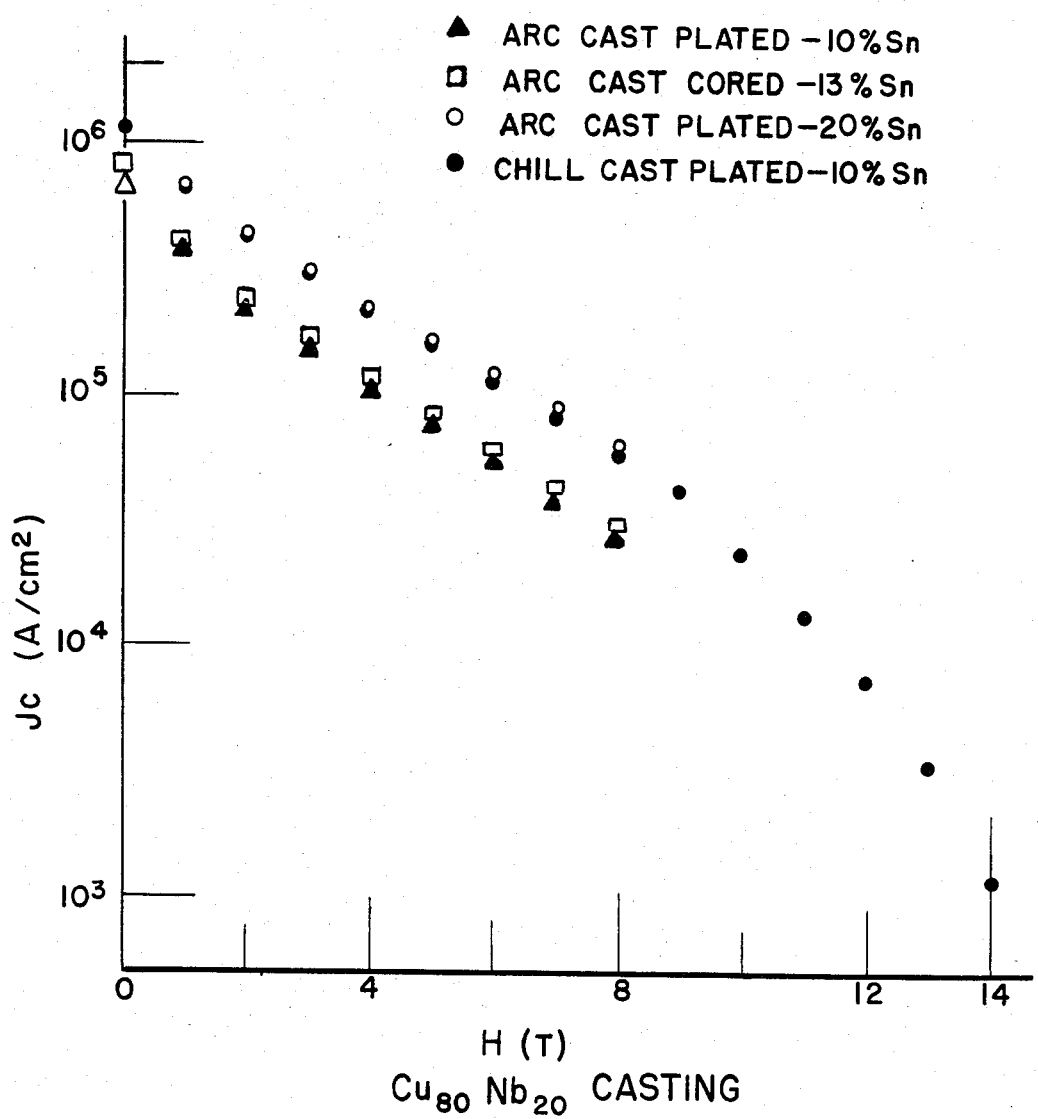

METHOD OF PREPARING COMPOSITE SUPERCONDUCTING WIRE

The United States Government has rights in this invention pursuant to Contract W-7405-Eng-82 between the U.S. Department of Energy and Ames Laboratory.

This application is a continuation-in-part of U.S. patent application Ser. No. 85,653 filed Oct. 17, 1979, now abandoned.

BACKGROUND AND PRIOR ART

This invention relates to an improved method of preparing composite superconducting wire. More specifically, this invention relates to an improved method for preparing a composite superconducting wire consisting of multifilaments of $Nb_3Sn$ in a copper matrix.

One method presently used for preparing multifilament superconducting wire such as $Nb_3Sn$ in a predominantly copper matrix consists of drilling a plurality of evenly spaced holes in a copper or bronze billet, inserting niobium rods in each hole, and extruding and drawing the billet in several steps until the niobium rods are reduced to the desired filament size. The wire is then coated with tin and heated to react the tin and niobium in order to form $Nb_3Sn$. The process is expensive and exacting and the size generally limited to filaments larger than 2 $\mu$m in diameter.

In another method, cylindrical rods of niobium are inserted into tubes of copper to form composite rods. A large number of the composite rods, which are hexagonal in cross section to improve packing density, are tightly packed into an extrusion can of normal metal, sealed and reduced in cross section by various methods of hot and cold working to produce a multifilament composite wire. The wire then must be coated with tin or heated in a tin-containing atmosphere to form $Nb_3Sn$. Preparation of the composite rods in difficult and time-consuming because of the close tolerances necessary to ensure a good bonding between the metals and to prevent contamination. The hexagonal outer surface of the tubes must be dimensionally accurate so that large numbers of the tubes can be tightly packed into the extrusion can to prevent trapping of gas or other contaminants between the rods which would affect superconductivity. Thus preparation of superconducting wire by this method is time-consuming and expensive.

To overcome the difficulties of the prior art methods for preparing composite multifilament superconductors, a ductile alloy suitable for preparing composite superconductors was developed. The alloy consists of copper containing at least 15 weight percent niobium which is present in the copper as discrete, randomly distributed and oriented, elongated discontinuous dendritic-shaped particles having an aspect ratio of about 50 to 100, the dendrites generally being from about 1 to 25 $\mu$m in diameter and from about 100 to 250 $\mu$m in length. The alloy, a method of making the alloy and a method of preparing composite superconducting wire from the alloy are described in copending U.S. patent application Ser. No. 19,808, filed Mar. 12, 1979, now U.S. Pat. No. 4,378,330, dated Mar. 29, 1983 assigned to the common assignee, and incorporated herein by reference. As described therein, when a billet of the alloy is mechanically reduced to wire, the niobium dendrites elongate and align parallel to the axis of the wire to give long discontinuous filaments of niobium in a copper matrix.

The wire is then coated with tin and heated to diffuse the tin into the wire to react with the niobium to form $Nb_3Sn$ which is a brittle compound. It was found that the tin will diffuse at temperatures sufficiently low to permit coils for magnets or similar devices to be wound from the ductile tin-coated wire before heating to diffusion temperature without destroying insulation used in preparing the coils.

While these methods will produce composite wire having good superconducting and mechanical properties, the fabrication procedures are not completely satisfactory for the preparation of large quantities of superconducting wire. For example, the application of a layer of tin to long lengths of small diameter wire is expensive. Thick layers of tin applied to the outer surface of large diameter wires are unstable and tend to "ball-up" when they are first melted in the reaction process. This produces brittleness in the tin-rich regions and poor superconducting performance in the tin-deficient regions. Braiding the cable wire after tin plating, but before the diffusion, tends to smear the relatively soft tin layer, while diffusion times for large cross-sectional wire are rather long, making the process time-consuming and increasing the cost.

SUMMARY OF THE INVENTION

An improved method for preparing composite multifilament superconducting wire has been developed which eliminates most of the before mentioned problems and which permits the economical preparation of large quantities of composite superconducting material. The invention, for preparing composite, multifilament superconducting electrical wire, consists of preparing a generalized cylindrical-shaped billet of an alloy of copper containing at least 15 weight percent niobium, the niobium being present in the copper as discrete, randomly distributed and oriented, elongated discontinuous dendritic-shaped particles having an aspect ratio of about 50 to 100, the dendrites generally being from about 1 to 25 $\mu$m in diameter and from about 100 to 250 $\mu$m in length, providing at least one longitudinal hole through the billet, dispensing tin evenly throughout the length of the hole to form a composite drawing rod, the tin being present in an amount sufficient to react with the niobium in the rod to form $Nb_3Sn$ and drawing the composite rod down to form a ductile composite multifilament wire containing a fine filament of tin, the billet being reduced to wire according to a pre-determined reduction ratio to optimize the critical current density for a particular magnetic field strength. The wire may then be heated for a period of time sufficient to diffuse the tin throughout the wire to react with the niobium to form $Nb_3Sn$. Alternatively, the wire may be wound into coils for magnets or similar devices before it is heated to form the $Nb_3Sn$. This permits coils or similar products to be prepared from the wire while it is still ductile rather than after the brittle A-15 compound $Nb_3Sn$ has been formed.

The billet of the alloy of copper and niobium may be prepared by a chill-casting method as described in the above-referenced patent or, preferably, it can be prepared by a consumable electrode arc-casting method which will be described in detail hereinafter. For some applications, the exterior surface of the copper-niobium alloy billet is provided with a tin diffusion barrier and an outer jacket of a ductile normal metal such as copper before working to form the wire. This provides a ductile metal layer on the wire to improve drawing qualities of the billet and to improve the cryogenic stability of the superconducting wire.

Preparation of composite superconducting wire by the method of the invention has several advantages over prior art methods of preparing such wire. For example, insertion of the tin core into the billet eliminates the costly tin plating of long lengths of wire required by prior art methods of producing wire. Since the diffusion paths in the drawn wire are very short, the temperature to react the tin with the niobium is low enough to enable the wire to be wound into coils for magnets before the wire is heat-treated to form Nb$_3$Sn. By inserting the tin into the billet in a plurality of longitudinal holes rather than a single axial opening, it is possible to prepare larger diameter wire because the tin diffusion path is shortened. By reducing the billet to wire at a specific reduction ratio, it is possible to maximize the critical current density.

It is therefore an object of the invention to provide an improved method for making composite multifilament superconducting wire.

It is another object of the invention to provide an improved method for making composite multifilament superconducting wire of Nb$_3$Sn in a copper matrix.

It is still another object of the invention to provide an improved method of making composite multifilament superconducting Nb$_3$Sn wire which eliminates the necessity of coating the wire with tin.

It is a further object of the invention to provide an improved method of preparing billets of copper-niobium in which the niobium is present in the copper as discrete, randomly distributed and oriented, elongated, discontinuous dendritic-shaped particles having an aspect ratio of about 50 to 100, the dendrites generally being from about 1 to 25 $\mu$m in diameter and from about 100 to 250 $\mu$m in length.

Finally, it is the object of the invention to provide an improved method for making multifilament composite superconducting wire of Nb$_3$Sn in a copper matrix which is suitable for the production of large quantities of the wire.

BRIEF DESCRIPTION OF THE DRAWINGS

FIG. 1 is a graph showing a comparison of critical currents of tin core wires made by the method of the invention with tin-plated wires prepared by prior art methods.

FIG. 2 is a graph showing a comparison of high field critical current data between wire made by the process of the invention and tin-plated wires prepared by prior art methods.

FIG. 3 is a graph showing a comparison of the performance characteristics of wire made by the arc-casting process with wire made by the chill-casting process.

DESCRIPTION OF THE PREFERRED EMBODIMENT

Figure 4:
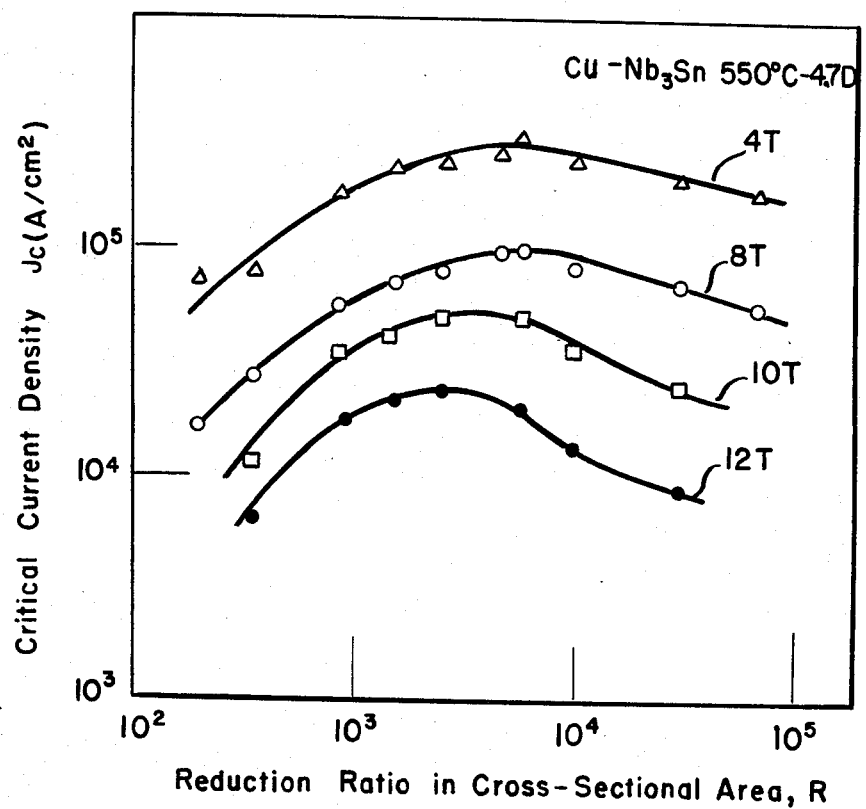
FIG. 4 is a graph of the critical current density, $J_c$, as a function of area reduction, R, for magnetic field strengths ranging from 4 to 12T.

These and other objects of the invention may be met by preparing a billet of an alloy of copper containing from about 20–40 weight percent niobium, the niobium being present in the copper as discrete, randomly distributed and oriented, elongated, discontinuous dendritic-shaped particles having an aspect ratio of about 50 to 100, the dendrites generally being from about 1 to 25 $\mu$m in diameter and from about 100 to 250 $\mu$m in length, applying a thin layer of tantalum as a tin diffusion barrier to the outer surface of the billet, applying an outer jacket of copper over the diffusion barrier to form an extrusion billet, hot-extruding the jacketed billet to form a composite drawing tube having an axial hole, the volume of the hole being sufficient to contain at least a stoichiometric amount of tin to react with the niobium in the billet to form Nb$_3$Sn, filling the hole with an alloy of tin containing about 5 weight percent copper to form a composite drawing rod, cold-working the composite rod to form an elongated composite wire of a desired shape and size containing a fine filament of tin whereby the dendritic-shaped particles are oriented parallel to the longitudinal axis of the wire and elongated to form fine discontinuous filaments of niobium in a copper matrix, the reduction ratio of the billet to the wire being pre-determined to optimize $J_c$, heating the wire to diffusion temperature for a period of time sufficient to react the tin present in the wire with the niobium to form Nb$_3$Sn.

The copper alloy must contain at least 15 weight percent niobium and may contain up to 60 weight percent niobium, although at concentrations of 60 percent and higher the alloy begins to lose some ductility. Preferably the alloy will contain about 20 to 40, most preferably about 30 weight percent niobium. Impurities such as tantalum, vanadium, gallium, aluminum or indium in amounts from about 1 to about 10 weight percent may be added to the alloy in order to improve properties of the superconducting wire such as upper critical field. While it is impossible to define the amounts and impurities to provide an improvement in a specific property, improvements are well known and readily determinable by those skilled in the art.

The copper-niobium alloy in which the niobium is present as dendritic-shaped particles may be prepared by a chill-casting technique as described in the prior art patent application as cited hereinbefore. Preferably, however, the alloy is prepared by consumable electrode arc-casting which permits the preparation of larger quantities of alloy at one time. In consumable electrode arc-casting, a first electrode is prepared which may consist of a niobium rod surrounded by a concentric layer of copper, or a bundle of rods of copper and niobium. In either case, the quantity of niobium and copper must be of the weight ratio desired in the final alloy. The elongated electrode is inserted longitudinally into a cylindrical-shaped mold. Under an inert atmosphere, preferably argon or helium, an arc is struck between the end of the electrode and the bottom of the mold, melting the copper which runs over the niobium, alloys with it and drips into the bottom of the mold to form a molten pool. The arc is maintained between the end of the electrode and the molten pool by continuously positioning the electrode to maintain a constant power consumption in the arc. At the same time, the molten metal pool is being cooled from the bottom of the mold to form a solid billet of alloy, while carefully maintaining a pool of molten metal on the top of the billet completely liquid. This is necessary to ensure that the niobium in the molten pool coalesces as the metals cool to form the discrete randomly distributed and oriented elongated, discontinuous dendritic-shaped particles having an aspect ratio of about 50 to 100, the dendrites generally being from about 1 to 25 $\mu$m in diameter and from about 100 to 250 $\mu$m in length. Satisfactory results have been attained by using a water-cooled copper mold which contains a lining of graphite around the inner wall. The graphite liner acts as a thermal insulator to retard cooling of the pool of molten metal through the wall of the mold and to direct cooling from the bottom of the mold and billet as it is formed in an upward direction in order to promote growth of the niobium dendrites. Preferably the bottom of the mold contains some niobium and copper alloy turnings which act as a strike pad when the arc is struck to assist in initiating the arc. After the casting has been completed, the resulting billet may be treated as herein described. Preferably the billet is reduced in size and formed into a second electrode and a second consumable arc-casting is made. This second melting is preferred in order to ensure proper dendrite formation and a uniform dispersion of the niobium dendrites.

The composite drawing rod may be prepared from the cylindrical-shaped cast alloy by one of two methods. In the preferred method, the cast alloy billet is machined to remove any graphite from the outer surface, and a small hole is bored in the axis of the cylinder. A tin diffusion barrier is applied to the outer surface of the cylinder and the cylinder is welded under a vacuum into a copper extrusion can. The composite assembly is then hot-extruded over a mandrel to form a thick-walled tube. The center of the tube is then filled with an alloy of tin—5 weight percent copper to prepare the composite rod for drawing.

Alternatively, the cast billet is provided with at least one longitudinal hole by drilling, which is then filled with a tin—5 weight percent copper alloy. The outer surface of the tin alloy-filled casting is then provided with a diffusion barrier and a copper jacket as before. Since the tin is already present, the billet must be cold-extruded to form the composite drawing rod in order not to melt the tin. The rod can then be cold worked to form the wire.

It is preferred that the extrusion billets be jacketed in high-purity copper before extruding in order that the composite drawing rod be easier to cold work by preventing galling of the dies and to also improve the cryostability of the completed composite wire. The copper outer layer of the completed wire also provides a normal metal insulation barrier which may eliminate the need for added electrical insulation in some magnet installations.

Preferably the jacketed billet is provided with a tin diffusion barrier to prevent contamination of the outer layer of copper by tin during the diffusion step, although for some applications the barrier may not be needed. This barrier may be of any of the known barrier materials such as tantalum, niobium or molybdenum. The barrier may be a thin layer such as 0.1 to 0.5 $\mu$m in thickness and may be applied mechanically as a foil or by plating such as by vapor deposition.

The billet must be provided with at least one longitudinal hole, but may be provided with a plurality of evenly spaced holes. For example, a single axial hole may be provided or an evenly spaced array of holes around an axial hole may be used, since a plurality of holes would reduce the diffusion distance particularly in larger diameter wire. The total volume of the holes must be sufficient to contain a stoichiometric amount of tin necessary to react with the niobium in the billet. Preferably the volume will be sufficient to contain a slight excess of tin, generally 1 to 2% excess to provide for some tin which will react with the copper. For example, a billet of copper—20 weight percent niobium alloy would require about a 10 volume percent hole while a billet of copper—30 weight percent niobium alloy requires about a 14 volume percent hole. The tin, which can be applied by pouring molten into the holes, may be pure, but preferably contains about 1-10 weight percent, most preferably about 5 weight percent, copper. The addition of the copper helps to improve the flow stress of the tin.

Multifilament wire can be prepared by suitably cold-working the composite drawing rod down to achieve sufficient size reduction to form a composite wire discontinuous niobium filaments and at least one tin filament in a copper matrix. Since the alloy which comprises the rod is very ductile, it is usually possible to accomplish this reduction without resorting to any intermediate anneals.

The method of the subject invention also allows for a maximum critical current density, $J_c$, to be achieved by selection of an appropriate reduction ratio, R. The reduction ratio is defined as the ratio of the cross-sectional area of the copper-niobium billet to the cross-sectional area of the cold-worked composite wire. FIG. 4 is a graph of $J_c$ as a function of R for magnetic field strengths ranging from 4 to 12T for Cu-20 wt% Nb wire, 0.15 mm in diameter, coated at with 9.3 volume % Sn and reacted at 550° C. for 4.7 days. The graph shows two striking results. First, a maximum occurs in $J_c$ as a function of R, and second, the maximum shifts to smaller R at high fields.

These results can be explained by considering the possible mechanisms of superconductivity in the composite wire. The reduction ratio is to a large extent determinative of the thickness of the cold-worked Nb filaments, such that a larger reduction ratio results in thinner filaments. As the filaments become thinner, they tend to coarsen, and this lessens their superconductivity. Thinner filaments also result in a greater superconducting-normal-superconducting, or SNS junction area. These junctions are regions in which normal copper is "sandwiched" between two elongated superconducting $Nb_3Sn$ filaments. When the SNS junction area is very large, high currents can pass from one superconducting $Nb_3Sn$ filament to another without inducing superconducting behavior in the normal copper. Thus, the effective resistivity of the composite may become extremely small even if there are totally normal Cu bridges separating the filaments.

An alternative mechanism for superconductivity in a composite with discontinous filaments is the proximity effect. In this mechanism, the copper can itself acquire superconducting properties by the migration of superconducting Copper pairs from the $Nb_3Sn$ to the Cu. This mechanism predominates more at low magnetic fields.

Referring again to FIG. 4, the curve for magnetic field strength 12T shows that as R ranges from about 200 to about 2500, both of the aforementioned superconductivity mechanisms lead to an increase in $J_c$. Beyond R=2500, the coarsening of the filaments becomes significant and the superconductivity begins to fall, and when R is greater than about 6500 the $J_c$ is considerably lower than the maximum. Thus, the curve exhibits a maximum $J_c$ when R is about 2500. At magnetic field strengths of 10T or greater, R is preferably, but not necessarily, in the range of about 2000 to about 3000. At lower magnetic fields, the proximity effect causes $J_c$ to increase with R even beyond the point where coarsening becomes important. Thus, at lower magnetic fields, the maximum $J_c$ is at a higher R and the maximum is not as sharp.

It therefore can be seen that the method of the subject invention allows for the attainment of the maximum critical current for a given magnetic field strength by proper selection of the reduction ratio of the billet to wire.

Because the diameter of the filaments is small and the diffusion paths are short, it has been found that a temperature of only 550° C. or less, for several days is sufficient to react the tin with the niobium and form $Nb_3Sn$. This makes it possible to wind the wire into magnets before heat treatment because many electrical insulators such as quartz are not affected at this temperature although they may be destroyed at higher temperatures.

The resulting composite superconducting wire product has a critical current ($J_c$) greater than $10^6$ A/cm$^2$ at H=0, a $J_c$ greater than $10^5$ A/cm$^2$ at H=7 Tesla, and a $J_c$ greater than $10^4$ A/cm$^2$ at H=14 Tesla. The copper jacket and diffusion barrier provide cryostability and good turn to turn insulation for the wires. The outer surface of the wire is well suited for braiding. The wire can be rolled into ribbons before reaction if that geometry is desired. A wide range of parameters such as niobium content, tin content, dendrite size, filament, area reduction, reaction temperature and reaction times are available with the method of the invention so that composite wires can be designed for a number of specific applications such as superconducting magnets, transmission lines and generators.

The following examples are given as illustrative of the invention and are not to be taken as limiting the scope of the invention as defined by the appended claims.

EXAMPLE I

A $Cu_{80}Nb_{20}$ alloy was melted at 1850° C. in a graphite mold and cast into a water-cooled copper chill mold 5 cm in diameter and 18 cm long. The casting was then machined to 4.76 cm outer diameter and a 0.6 cm hole was drilled along the axis of the cylinder. The cylinder was jacketed with a 0.154 cm copper layer and hot-extruded around a mandrel to produce a tube having a 0.508 cm ID by 1.35 cm OD. The hole was filled with a tin—5 weight percent Cu alloy to form a composite drawing tube. The composite tube was drawn to 0.0152 cm wire without any annealing.

The magnetic field dependence of the critical current ($J_c$) in fields up to 16 Tesla was determined for the wire and is shown in FIG. 1. The figure also compares the results with 20 and 30% niobium wire prepared by chill casting and tin plating the surface of the wire to diffuse the tin externally. It can be seen that the tin core sample has essentially the same $J_c$ vs H curve as a tin-plated sample with the same niobium content. A standard commercial multifilament wire is shown for comparison.

The functional dependence of the $J_c$ vs H curve follows the Kramer relation at high field just as one finds for continuous filament high field superconductors as shown in FIG. 2. Here $J_c^{\frac{1}{2}}H^{\frac{1}{4}}$ is linear in H as expected from the Kramer relation. There is no evidence of unusual $J_c$ vs H behavior which might arise from the dicontinuous nature of the filaments in the long dendrite process materials. The pinning in these discontinuous filament materials seems to obey the same relations as for continuous filament materials.

EXAMPLE II

A $Cu_{80}Nb_{20}$ alloy was prepared from a 122 cm long electrode consisting of a 1.91 cm rod of niobium running coaxially down the center of a copper cylinder having an O.D. of 3.49 cm. This electrode was consumably arc-melted into a water-cooled copper cylinder fitted on the inside with a graphite liner of 5.24 cm I.D.×6.25 cm O.D. A strike pad assembly was positioned at the bottom of the copper cylinder for initiation of the arc. It consisted of a 0.69 cm thick plate of $Cu_{70}Nb_{30}$ alloy on top of a 0.64 cm thick plate of graphite. A 1.2 cm height of $Cu_{80}Nb_{20}$ turnings was placed on top of these two plates. The electrode was melted with a current of around 1000 amps at an arc voltage of around 26 volts. Chamber pressure was maintained at 0.5 atm with argon gas. The billet was removed from the graphite sleeve with a jolter and after polishing its surface, it was rod-rolled to 3.49 cm. This rod was then used as the electrode and the above-described consumable arc-melting process repeated. After cleaning, the final billet was cut to short lengths, 7 to 15 cm, and processed to wire as described in Example I.

The magnetic field dependence of the critical current ($J_c$) in fields up to 8 Tesla was determined for the wire and is shown in FIG. 3 as the arc-cast cored—13% data. It is seen that the data are slightly lower than data on chill-cast wire prepared by the tin-plating process.

EXAMPLE III

Example II was repeated except that the tin was applied to the wire using the external tin-plating process rather than the internal tin-core process. The data for $J_c$ versus H are also shown in FIG. 3, and it is seen that when 20% tin is used, the data are equivalent to the chill-cast material.

Thus, it can be seen from the proceeding discussion and examples that the invention provides an economical and effective method for preparing large quantities of composite multifilament superconducting wire consisting of $Nb_3Sn$ in a copper matrix.

We claim:

1. A method of preparing composite multifilament superconducting wire comprising:
   providing a generalized cylindrical-shaped billet of an alloy of copper containing at least 15 weight percent niobium, the niobium being present in the copper as discrete, randomly distributed and oriented, elongated dendritic-shaped particles having an aspect ratio of about 50 to 100, the dendrites generally being from about 1 to 25 μm in diameter and from about 100 to 250 μm in length;
   providing at least one longitudinal hole through the billet, the volume of the hole being such that when filled with tin it can contain a stoichiometric amount to react with the niobium in the tube to form $Nb_3Sn$;
   filling the hole with tin to form a composite drawing rod;
   cold-working the composite rod to form an elongated wire of a desired shape and size to orient the dendritic-shaped particles parallel to the longitudinal axis of the wire and to elongate the particles to form a wire containing a plurality of fine filaments of niobium and at least one filament of tin in a copper matrix.

2. The method of claim 1 wherein the composite rod is cold-worked to wire according to a pre-determined reduction ratio in order to obtain a maximum critical current density for a particular magnetic field strength.

3. The method of claim 2 wherein the reduction ratio ranges from about 200 to about 6500 for a magnetic field strength of about 4–14T.

4. The method of claim 3 wherein the reduction ratio ranges from about 2000 to about 3000 for a magnetic field strength of about 10–14T.

5. The method of claim 1 including the additional step of heating the wire to tin diffusion temperature and maintaining the temperature for a period of time sufficient for the tin to diffuse through the wire and react with the niobium filaments to form $Nb_3Sn$.

6. The method of claim 1 wherein the longitudinal hole through the billet is provided by hot-extruding the billet over a mandrel to form a thick-walled tube having an axial hole and filling the hole with tin, thereby forming the composite drawing tube.

7. The method of claim 6 wherein the exterior surface of the billet is provided with an inner tin diffusion barrier and an outer layer of a ductile normal metal before the billet is hot-extruded.

8. The method of claim 7 wherein the tin diffusion barrier is selected from the group consisting of tantalum, niobium and molybdenum, and the ductile normal metal outer layer is copper.

9. The method of claim 8 including the additional step of heating the wire to tin diffusion temperature and maintaining the temperature for a period of time sufficient for the tin to diffuse through the wire and react with the niobium filament to form $Nb_3Sn$.

10. The method of claim 1 wherein the longitudinal hole through the billet is provided by drilling filling the hole with tin and cold extruding the billet containing the tin to form a composite drawing rod.

11. The method of claim 10 wherein the exterior of the billet is provided with an inner tin diffusion barrier and an outer layer of a ductile normal metal before the billet is cold-extruded.

12. The method of claim 11 wherein the tin diffusion barrier is selected from the group consisting of tantalum, niobium and molybdenum, and the ductile normal metal outer layer is copper.

13. The method of claim 12 including the additional step of heating the wire to tin diffusion temperature and maintaining the temperature for a period of time sufficient for the tin to diffuse through the wire and react with the niobium filament to form $Nb_3Sn$.

14. A method of preparing composite multifilament superconducting wire comprising:
   preparing a generalized cylindrical-shaped billet of an alloy of copper containing at least 15 weight percent niobium, the niobium being present in the copper as discrete, randomly distributed and oriented, elongated dendritic-shaped particles having an aspect ratio of about 50 to 100, the dendrites generally being from about 1 to 25 μm in diameter and from about 100 to 250 μm in length, wherein the method of billet preparation comprises;
   a. preparing an elongated electrode of copper and niobium, the electrode containing at least 15 weight percent niobium;
   b. inserting the electrode longitudinally into a cylindrical-shaped mold;
   c. striking an arc between the end of the electrode and the bottom of the mold to melt the end of the electrode which falls to the bottom of the mold, forming a pool of molten copper and niobium;
   d. maintaining the arc between the end of the electrode and the molten pool to continuously melt the end of the electrode which falls into the mold, forming a continuously rising pool of molten metal; and
   e. simultaneously with step d, continuously cooling the molten metal pool from the bottom of the mold upward to form a solid billet of ductile alloy while maintaining the pool of molten metal on top of the billet, whereby the niobium in the molten pool coalesces as the metals cool to form discrete, randomly distributed and oriented, elongated, dendritic-shaped particles of niobium in the copper;
   providing at least one longitudinal hole through the billet, the volume of the hole being such that when filled with tin it can contain a stoichiometric amount to react with the niobium in the tube to form $Nb_3Sn$;
   filling the hole with tin to form a composite drawing rod;
   cold working the composite rod to form an elongated wire of a desired shape and size to orient the dendritic-shaped particles parallel to the longitudinal axis of the wire and to elongate the particles to form a wire containing a plurality of fine filaments of niobium and at least one filament of tine in a copper matrix.

15. The method of claim 14 wherein the method of billet preparation includes the additional steps of;
   f. removing the billet from the mold;
   g. reducing the diameter of the billet to form a second electrode; and
   h. repeating steps b, c, d and e thereby forming a second billet of copper and niobium wherein the niobium is present as discrete, randomly distributed and oriented, elongated, dendritic-shaped particles.

16. The method of claim 14 wherein the electrode of step a consists of a plurality of elongated rods of copper and niobium.

17. The method of claim 14 wherein the electrode of step a consists of a tube of copper containing a niobium core.

18. The method of claim 14 wherein the composite rod is cold-worked to wire according to a pre-determined reduction ratio in order to obtain a maximum critical current density for a particular magnetic field strength.

19. The method of claim 18 wherein the reduction ratio ranges from about 200 to about 6500 for a magnetic field strength of about 4–14T.

20. The method of claim 19 wherein the reduction ratio ranges from about 2000 to about 3000 for a magnetic field strength of about 10–14T.

21. The method of claim 14 including the additional step of heating the wire to tin diffusion temperature and maintaining the temperature for a period of time sufficient for the tin to diffuse through the wire and react with the niobium filaments to form $Nb_3Sn$.

22. The method of claim 14 wherein the longitudinal hole through the billet is provided by hot-extruding the billet over a mandrel to form a thick-walled tube having an axial hole, and filling the hole with tin, thereby forming the composite drawing tube.

23. The method of claim 22 wherein the exterior surface of the billet is provided with an inner tin diffusion barrier and an outer layer of a ductile normal metal before the billet is hot-extruded.

24. The method of claim 23 wherein the tin diffusion barrier is selected from the group consisting of tantalum, niobium, and molybdenum, and the ductile normal metal outer layer is copper.

25. The method of claim 24 including the additional step of heating the wire to tin diffusion temperature and maintaining the temperature for a period of time sufficient for the tin to diffuse through the wire and react with the niobium filament to form $Nb_3Sn$.

26. The method of claim 14 wherein the longitudinal hole through the billet is provided by drilling, filling the hole with tin and cold-extruding the billet containing the tin to form a composite drawing rod.

27. The method of claim 26 wherein the exterior of the billet is provided with an inner tin diffusion barrier and an outer layer of a ductile normal metal before the billet is cold-extruded.

28. The method of claim 27 wherein the tin diffusion barrier is selected from the group consisting of tantalum, niobium, and molybdenum, and the ductile normal metal outer layer is copper.

29. The method claim 28 including the additional step of heating the wire to tin diffusion temperature and maintaining the temperature for a period of time sufficient for the tin to diffuse through the wire and react with the niobium filament to form $Nb_3Sn$.

* * * * *